(12) United States Patent   (10) Patent No.:   US 12,672,303 B2
Yoshida   (45) Date of Patent:   Jun. 30, 2026

(54) HIGH ELECTRON MOBITY TRANSISTOR WITH GRADIENT ALUMINUM COMPOSITION IN BARRIER LAYER

(71) Applicant: SUMITOMO ELECTRIC INDUSTRIES, LTD., Osaka (JP)

(72) Inventor: Shigeki Yoshida, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 651 days.

(21) Appl. No.: 18/057,972

(22) Filed: Nov. 22, 2022

(65) Prior Publication Data

US 2023/0246070 A1   Aug. 3, 2023

(30) Foreign Application Priority Data

Jan. 28, 2022   (JP) ................................. 2022-012243

(51) Int. Cl.
H10D 30/47   (2025.01)
H10D 30/01   (2025.01)
H10D 62/17   (2025.01)
H10D 62/85   (2025.01)

(52) U.S. Cl.
CPC ......... H10D 30/475 (2025.01); H10D 30/015 (2025.01); H10D 62/235 (2025.01); H10D 62/8503 (2025.01)

(58) Field of Classification Search
CPC ............. H10D 62/8503; H10D 30/015; H10D 30/475; H10D 62/852; H01L 21/02505
See application file for complete search history.

(56) References Cited

U.S. PATENT DOCUMENTS

| | | | |
|---|---|---|---|
| 2012/0132962 A1* | 5/2012 | Sato ...................... | C30B 29/403 |
| | | | 257/E29.091 |
| 2019/0157441 A1* | 5/2019 | Yamada ............... | H10D 30/015 |
| 2022/0028981 A1* | 1/2022 | Fujikura .............. | H10D 62/854 |
| 2022/0051888 A1* | 2/2022 | Nam ................... | H10D 30/475 |

FOREIGN PATENT DOCUMENTS

WO   2016/155794   10/2016

* cited by examiner

*Primary Examiner* — Davienne N Monbleau
*Assistant Examiner* — Dmitri Mihaliov
(74) *Attorney, Agent, or Firm* — IPUSA, PLLC

(57)   ABSTRACT

A semiconductor device including: a substrate; a channel layer that is provided on the substrate and that includes Ga and N; and a barrier layer that is provided on the channel layer and includes a first surface that faces the channel layer and a second surface opposite to the first surface, the barrier layer containing Al, N, and at least one of Ga or In; wherein an average value of an Al composition in the barrier layer is 30% or more, and wherein in an Al composition profile in the barrier layer, a slope of a first straight line connecting a first point and a second point is 20%/nm or more and 65%/nm or less.

13 Claims, 13 Drawing Sheets

DISTANCE FROM FIRST SURFACE (nm)

HIGH ELECTRON MOBITY TRANSISTOR WITH GRADIENT ALUMINUM COMPOSITION IN BARRIER LAYER

CROSS-REFERENCE TO RELATED APPLICATIONS

The present application is based upon and claims priority to Japanese Patent Application No. 2022-012243, filed on Jan. 28, 2022, the entire contents of which are incorporated herein by reference.

BACKGROUND OF THE INVENTION

1. Field of the Invention

The present disclosure relates to a semiconductor device and a method of manufacturing a semiconductor device.

2. Description of the Related Art

Conventionally, in a high electron mobility transistor (HEMT) having a channel layer and a barrier layer, it has been desired to increase output power and to improve high-frequency characteristics. For example, output power can be improved by increasing Al composition in the barrier layer. Also, a method of generating a heterostructure has been proposed, which includes a step of temporarily stopping supply of a Ga precursor and supplying only an Al precursor into a deposition chamber during formation of a barrier layer. As used herein, the term "precursor" refers to a substance that precedes, in a chemical reaction or the like, a certain substance to be generated. The term "Al composition" refers to a ratio of the number of Al atoms to the total number of Group III element atoms contained in a Group III-V semiconductor.

SUMMARY OF THE INVENTION

According to the present disclosure, a semiconductor device includes: a substrate; a channel layer that is provided on the substrate and that includes Ga and N; and a barrier layer that is provided on the channel layer and includes a first surface that faces the channel layer and a second surface opposite to the first surface, the barrier layer containing Al, N, and at least one of Ga or In; wherein an average value of an Al composition in the barrier layer is 30% or more, and wherein in an Al composition profile in the barrier layer, a slope of a first straight line connecting a first point and a second point is 20%/nm or more and 65%/nm or less, in which the first point is a point where the Al composition first reaches 10% upon increasing from the first surface toward the second surface, and the second point is a point where the Al composition first reaches 30% upon increasing from the first surface toward the second surface.

DESCRIPTION OF THE EMBODIMENTS

Description of Embodiments of Present Disclosure

Figure 1:
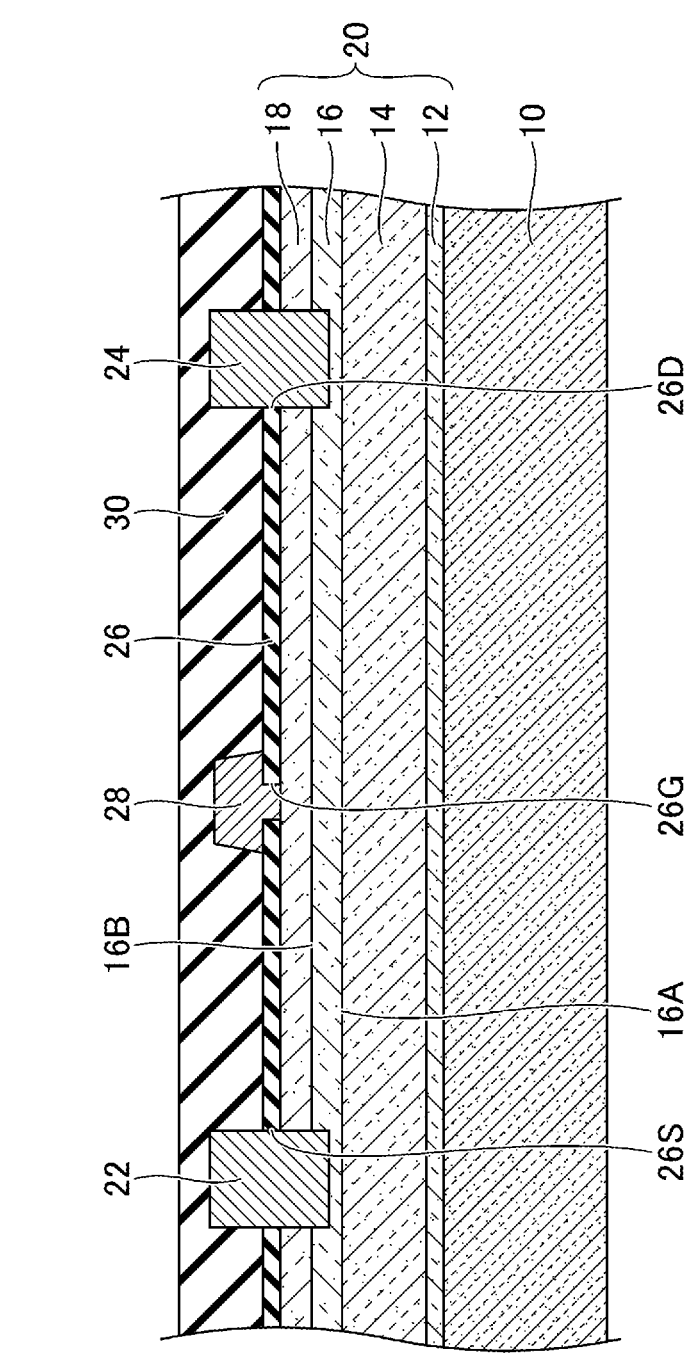
FIG. 1 is a cross-sectional view illustrating a semiconductor device according to a first embodiment.

First, the embodiments of the present disclosure are listed and described.

[1] According to one embodiment of the present disclosure, a semiconductor device includes: a substrate; a channel layer that is provided on the substrate and that includes Ga and N; and a barrier layer that is provided on the channel layer and includes a first surface that faces the channel layer and a second surface opposite to the first surface, the barrier layer containing Al, N, and at least one of Ga or In; wherein an average value of an Al composition in the barrier layer is 30% or more, and wherein in an Al composition profile in the barrier layer, a slope of a first straight line connecting a first point and a second point is 20%/nm or more and 65%/nm or less, in which the first point is a point where the Al composition first reaches 10% upon increasing from the first surface toward the second surface, and the second point is a point where the Al composition first reaches 30% upon increasing from the first surface toward the second surface.

Because the average Al composition in the barrier layer is 30% or more, high output power can be obtained. In addition, because the slope of the first straight line is 20%/nm or more and 65%/nm or less in the Al composition profile in the barrier layer, a two-dimensional electron gas (2DEG) generated near the barrier layer of the channel layer is less likely to move to the barrier layer. Accordingly, high electron mobility can be obtained, and excellent high-frequency characteristics can be obtained.

[2] In the semiconductor device of [1], in the Al composition profile, a slope of a second straight line connecting the first point and a third point may be 20%/nm or more and 65%/nm or less, in which the third point is a point where the Al composition first reaches 40% upon increasing from the first surface toward the second surface. In this case, movement of the 2DEG to the barrier layer can be further prevented.

[3] In the semiconductor device of [1] or [2], the channel layer may be a GaN layer, and the barrier layer is an AlGaN layer, an InAlN layer, or an InAlGaN layer. In this case, it is easy to form the channel layer and the barrier layer.

[4] In the semiconductor devices of [1] to [3], the average value of the Al composition in the barrier layer may be 35% or more. In this case, it is easy to improve output power.

[5] In the semiconductor devices of [1] to [4], the channel layer may include a third surface that faces the barrier layer. The channel layer may include a first layer including the third surface, the first layer having a concentration of C of $1 \times 10^{16}$ cm$^{-3}$ or less. In this case, electrons are less likely to scatter in the channel layer, and better electron mobility can be obtained.

[6] According to one embodiment of the present disclosure, a method of manufacturing a semiconductor device includes: forming, on a substrate, a channel layer that includes Ga and N; and forming, on the channel layer, a barrier layer that includes a first surface that faces the channel layer and a second surface opposite to the first surface, the barrier layer containing Al, N, and at least one of Ga or In; wherein an average value of an Al composition in the barrier layer is 30% or more, and wherein in an Al composition profile in the barrier layer, a slope of a first straight line connecting a first point and a second point is 20%/nm or more and 65%/nm or less, in which the first point is a point where the Al composition first reaches 10% upon increasing from the first surface toward the second surface, and the second point is a point where the Al composition first reaches 30% upon increasing from the first surface toward the second surface.

Because the average Al composition in the barrier layer is 30% or more, high output can be obtained. In addition, because the slope of the first straight line is 20%/nm or more and 65%/nm or less in the Al composition profile in the barrier layer, the 2DEG is less likely to move to the barrier layer. Accordingly, high electron mobility can be obtained, and excellent high-frequency characteristics can be obtained.

[7] In the method of [6], forming the barrier layer may include: supplying, as a first condition, ammonia and an Al precursor to a deposition chamber without supplying a Ga precursor and an In precursor for a time such that a single layer is not formed; supplying, as a second condition, ammonia, the Al precursor, and at least one of the Ga precursor or the In precursor to the deposition chamber to form a first semiconductor layer on the channel layer; and supplying, as a third condition, ammonia, the Al precursor, and at least one of the Ga precursor or the In precursor to the deposition chamber to form a second semiconductor layer on the first semiconductor layer. A first pressure in the deposition chamber in the first condition, a second pressure in the deposition chamber in the second condition, a third pressure in the deposition chamber in the third condition, a first flow rate of ammonia in the first condition, a second flow rate of ammonia in the second condition, and a third flow rate of ammonia in the third condition may satisfy at least one condition of: the first pressure and the second pressure are higher than the third pressure; or the first flow rate and the second flow rate are higher than the third flow rate. In this case, the slope of the first straight line L1 is likely to be 20%/nm or more and 65%/nm or less.

[8] In the method of [7], the first pressure may be equal to the second pressure, and the first flow rate may be equal to the second flow rate. In this case, it is easy to adjust the second pressure and the second flow rate.

[9] In the methods of [7] or [8], the second pressure may be equal to the third pressure, and the third flow rate may be smaller than the second flow rate. In this case, it is easy to obtain good crystallinity in the second semiconductor layer.

[10] In the methods of [7] to [9], in the second condition, flow rates of ammonia, the Al precursor, and at least one of the Ga precursor or the In precursor supplied to the deposition chamber may be adjusted so that an Al composition in the first semiconductor layer is 30% or less, and, in the third condition, flow rates of ammonia, the Al precursor, and at least one of the Ga precursor or the In precursor supplied to the deposition chamber may be adjusted so that an Al composition in the second semiconductor layer is higher than 30%. In this case, it is easy to obtain excellent high-frequency characteristics while obtaining high output power.

[11] In the methods of [7] to [10], in the second condition, supplying may be performed for a time such that a thickness of the first semiconductor layer is 0.5 nm or more and 3.0 nm or less. In this case, it is easy to obtain excellent high-frequency characteristics while obtaining high output power.

[12] In the method of [11], in the second condition, supplying may be performed for a time such that a thickness of the first semiconductor layer is 0.5 nm or more and 1.5 nm or less. In this case, it is easy to obtain even more excellent high-frequency characteristics.

[13] In the methods of [6] to [12], the channel layer may include a third surface that faces the barrier layer, and forming the channel layer may include forming a first layer including the third surface, the first layer having a concentration of C of $1 \times 10^{16}$ cm$^{-3}$ or less. In this case, it is easy to obtain higher electron mobility.

DETAILS OF EMBODIMENTS OF PRESENT DISCLOSURE

Embodiments of the present disclosure will be described in detail below, but the present disclosure is not limited thereto. In the present specification and the drawings, components having substantially the same functional configuration may be given the same reference numerals to omit redundant description.

First Embodiment

A first embodiment will be described. The first embodiment relates to a semiconductor device including a GaN-HEMT. FIG. 1 is a cross-sectional view illustrating a semiconductor device according to the first embodiment.

As illustrated in FIG. 1, a semiconductor device 1 according to the first embodiment includes a substrate 10 and a laminated structure 20. The substrate 10 is, for example, a silicon carbide (SiC) substrate having a (0001) plane. The stacking direction of the laminated structure 20 is, for example, the [0001] direction. The laminated structure 20 is provided on the substrate 10. The laminated structure 20 includes a nucleation layer 12, a channel layer 14, a barrier layer 16, and a cap layer 18.

The nucleation layer 12 is formed on the substrate 10. For example, the nucleation layer 12 is an AlN layer and the thickness of the nucleation layer 12 is 5 nm to 20 nm. The nucleation layer 12 functions as a seed layer for the channel layer 14.

The channel layer 14 is formed by epitaxial growth over the nucleation layer 12. The channel layer 14 includes Ga and N. For example, the channel layer 14 is an undoped GaN layer and the thickness of the channel layer 14 is 500 nm. The channel layer 14 functions as an electron transit layer.

The barrier layer 16 is formed by epitaxial growth on the channel layer 14. The barrier layer 16 contains Al, at least one of Ga or In, and N. For example, the barrier layer 16 is an $Al_XGa_{1-X}N$ layer (0.00≤X≤1.00), an $In_{1-X}Al_XN$ layer (0.00≤X≤1.00), or an $In_YAl_XGa_{(1-X-Y)}N$ layer (0.00≤X≤1.00, 0.00≤Y≤1.00), and the thickness of the barrier layer 16 is 5 nm to 30 nm. The band gap of the barrier layer 16 is larger than the band gap of the channel layer 14. The average value of the Al composition (X) in the barrier layer 16 is 30% or more (X≥0.30). The conductivity type of the barrier layer 16 is n-type or undoped. The barrier layer 16 and the channel layer 14 may be in contact with each other. A spacer layer (not illustrated) may be interposed between the barrier layer 16 and the channel layer 14. Strain occurs between the barrier layer 16 and the channel layer 14 due to a difference in lattice constant therebetween. Thus, 2DEG due to piezo-electric charge is generated in a region near the interface between the barrier layer 16 and the channel layer 14, the region being on the side of the channel layer 14, thereby forming a channel region. The barrier layer 16 functions as an electron supply layer.

The cap layer 18 is formed by epitaxial growth on the barrier layer 16. For example, the cap layer 18 is a GaN layer and the thickness of the cap layer 18 is 5 nm. For example, the conductivity type of the cap layer 18 is n-type. The cap layer 18 may not be provided.

The semiconductor device 1 has a passivation film 26. For example, the passivation film 26 is a nitride film, such as a silicon nitride film and the like, and the thickness of the passivation film 26 is 10 nm to 100 nm. A source opening 26S, a drain opening 26D, and a gate opening 26G are formed in the passivation film 26. The laminated structure 20 is exposed from the passivation film 26 at the source opening 26S, the drain opening 26D, and the gate opening 26G. Specifically, at the source opening 26S and the drain opening 26D, the cap layer 18 is removed to expose the barrier layer 16. At the gate opening 26G, the cap layer 18 is exposed.

The semiconductor device 1 includes a source electrode 22, a drain electrode 24, and a gate electrode 28. The source electrode 22 and the drain electrode 24 are arranged in order along the surface of the substrate 10.

The source electrode 22 covers the source opening 26S of the passivation film 26 and is in ohmic contact with the barrier layer 16 via the source opening 26S. The drain electrode 24 covers the drain opening 26D of the passivation film 26 and is in ohmic contact with the barrier layer 16 via the drain opening 26D. Each of the source electrode 22 and the drain electrode 24 is formed by heat-treating a titanium (Ti) layer and an aluminum (Al) layer provided in order from the side of the laminated structure 20.

The gate electrode 28 is provided between the source electrode 22 and the drain electrode 24 on the laminated structure 20. The gate electrode 28 covers the gate opening 26G of the passivation film 26 and is in Schottky contact with the cap layer 18 via the gate opening 26G. The gate electrode 28 includes, for example, a nickel (Ni) layer, a gold (Au) layer, and a tantalum (Ta) layer provided in order from the side of the laminated structure 20.

The semiconductor device 1 includes an insulating film 30 covering the source electrode 22, the gate electrode 28, and the drain electrode 24. The insulating film 30 is in contact with the passivation film 26 and extends along the passivation film 26. The insulating film 30 is made of an insulating material containing Si. The insulating film 30 is, for example, a SiN film, a $SiO_2$ film, or a SiON film.

Figure 2:
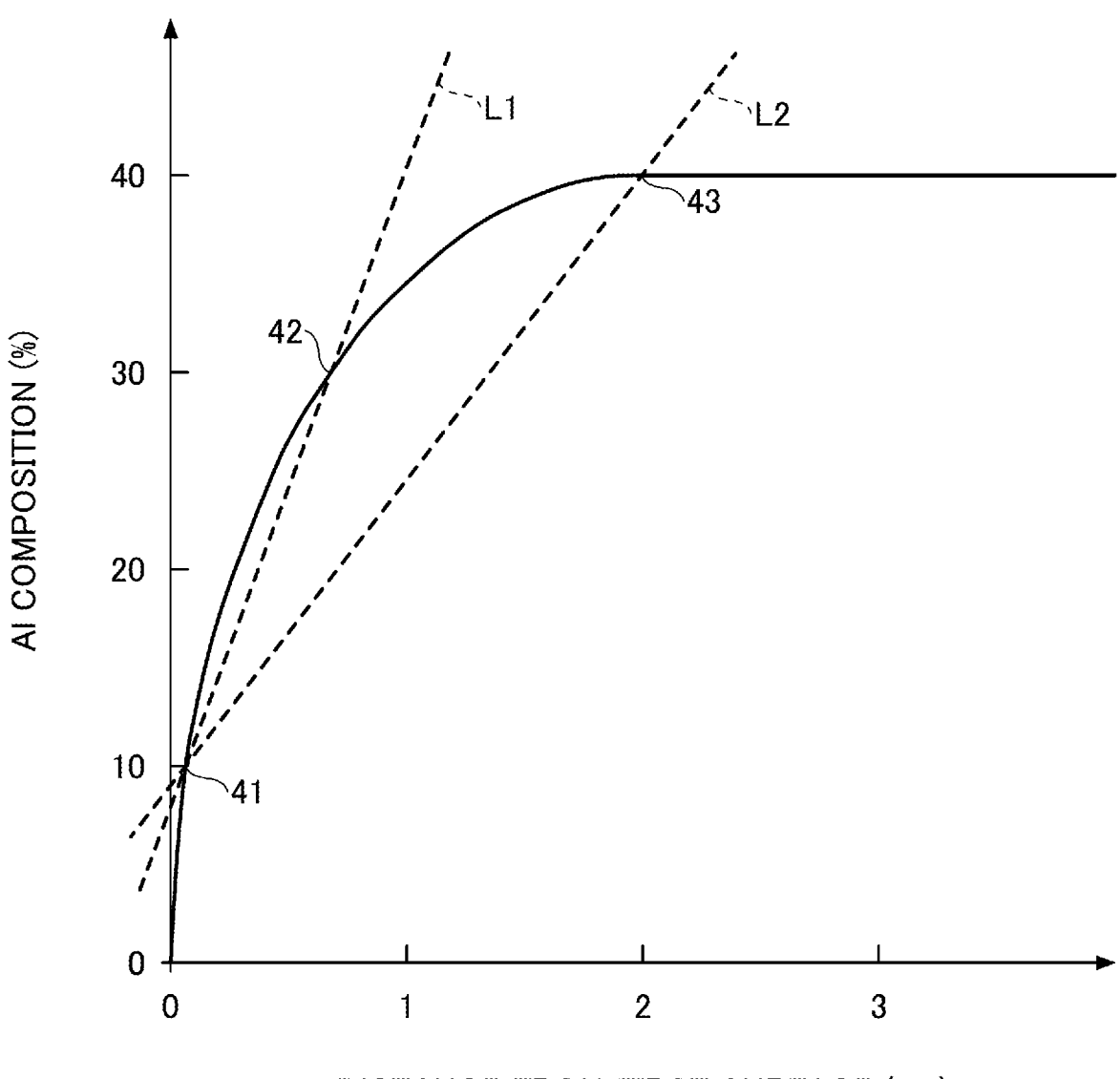
FIG. 2 is a diagram illustrating an example of an Al composition profile in a barrier layer.

Here, an Al composition profile in the barrier layer 16 will be described. FIG. 2 illustrates an example of an Al composition profile in the barrier layer 16. The horizontal axis of FIG. 2 indicates the distance from a first surface to a second surface. The vertical axis of FIG. 2 indicates the Al composition. The barrier layer 16 includes a first surface 16A that faces the channel layer 14 and a second surface 16B opposite to the first surface 16A. In the Al composition profile in the barrier layer 16, the slope of a first straight line L1 connecting a first point 41 and a second point 42 is 20%/nm or more and 65%/nm or less, in which the first point 41 is the point where the Al composition first reaches 10% (X=0.10) upon increasing from the first surface 16A toward the second surface 16B, and the second point 42 is the point where the Al composition first reaches 30% (X=0.30) upon increasing from the first surface 16A toward the second surface 16B.

In the semiconductor device 1 according to the first embodiment, the average value of the Al composition in the barrier layer 16 is 30% or more (X≥0.30). Accordingly, high output power can be obtained. Further, in the Al composition profile in the barrier layer 16, the slope of the first straight line L1 is 20%/nm or more and 65%/nm or less. Accordingly, the 2DEG generated near the barrier layer 16 of the channel layer 14 is less likely to move to the barrier layer 16. Because electrons are more likely to scatter in the barrier layer 16 than in the channel layer 14, electron mobility decreases when the 2DEG moves to the barrier layer 16. According to the present embodiment, because the movement of the 2DEG to the barrier layer 16 is prevented, high electron mobility can be obtained, and excellent high-frequency characteristics of the HEMT can be obtained. Thus, according to the first embodiment, the output power of the HEMT can be improved while obtaining excellent high-frequency characteristics.

The Al composition profile in the barrier layer 16 may be obtained by energy dispersive X-ray spectroscopy (EDX). The measurement interval in the thickness direction of the barrier layer 16 is 0.155 nm. Because the channel layer 14 does not contain Al, the first point 41 and the second point 42 can be identified without precisely specifying the interface (the first surface 16A) between the channel layer 14 and the barrier layer 16. The slope of the first straight line L1 is preferably 25%/nm or more and 65%/nm or less, more preferably 30%/nm or more and 65%/nm or less, and further preferably 40%/nm or more and 65%/nm or less. The greater the slope of the first straight line L1, the higher the density of the 2DEG can be obtained. However, it is difficult to set the slope of the first straight line L1 to be greater than 65%/nm. This is because diffusion of Al from the barrier layer 16 to the channel layer 14 inevitably occurs.

In the Al composition profile in the barrier layer 16, the slope of a second straight line L2 connecting the first point 41 and a third point 43 is preferably 20%/nm or more and 65%/nm or less, more preferably 25%/nm or more and 65%/nm or less, and further preferably 30%/nm or more and 65%/nm or less, in which the third point 43 is the point where the Al composition first reaches 40% (X=0.40) upon increasing from the first surface 16A toward the second surface 16B. The greater the slope of the second straight line L2, the higher the density of the 2DEG can be obtained. However, it is difficult to set the slope of the second straight line L2 to be greater than 65%/nm. This is because diffusion of Al from the barrier layer 16 to the channel layer 14 inevitably occurs, as described above.

The average value of the Al composition in the barrier layer 16 in the first embodiment is preferably 35% or more (X≥0.35), more preferably 38% or more (X≥0.38), and further preferably 40% or more (X≥0.40). The higher the average value of the Al composition in the barrier layer 16, the easier it is to improve the output power. Here, it is assumed that the first surface 16A of the barrier layer 16 on the channel layer 14 side is at the point in the Al composition profile where the Al composition last attained 5%, from the point where the maximum value of the Al composition in the barrier layer 16 is obtained in the direction towards the substrate 10. It is assumed that the second surface 16B on the opposite side of the barrier layer 16 is at the point in the Al composition profile where the Al composition last attained 5%, from the point where the maximum value of the Al composition in the barrier layer 16 is obtained in the direction towards the side opposite the substrate 10. The average value of the Al composition in the barrier layer 16 is the average value of the Al composition between the first surface 16A and the second surface 16B thus determined.

When the channel layer 14 is a GaN layer and the barrier layer 16 is an AlGaN layer, an InAlN layer, or an InAlGaN layer, it is easy to form the channel layer 14 and the barrier layer 16.

Next, a method of manufacturing the semiconductor device 1 according to the first embodiment will be described. FIGS. 3 to 10 are cross-sectional views illustrating a method of manufacturing the semiconductor device according to the first embodiment. In the following description, an AlGaN layer is formed as the barrier layer 16. When an InAlN layer is formed as the barrier layer 16, an In precursor such as trimethylindium (TMI) may be used instead of a Ga precursor. When an InAlGaN layer is formed as the barrier layer 16, an In precursor may be used in addition to the Ga precursor.

Figure 3:
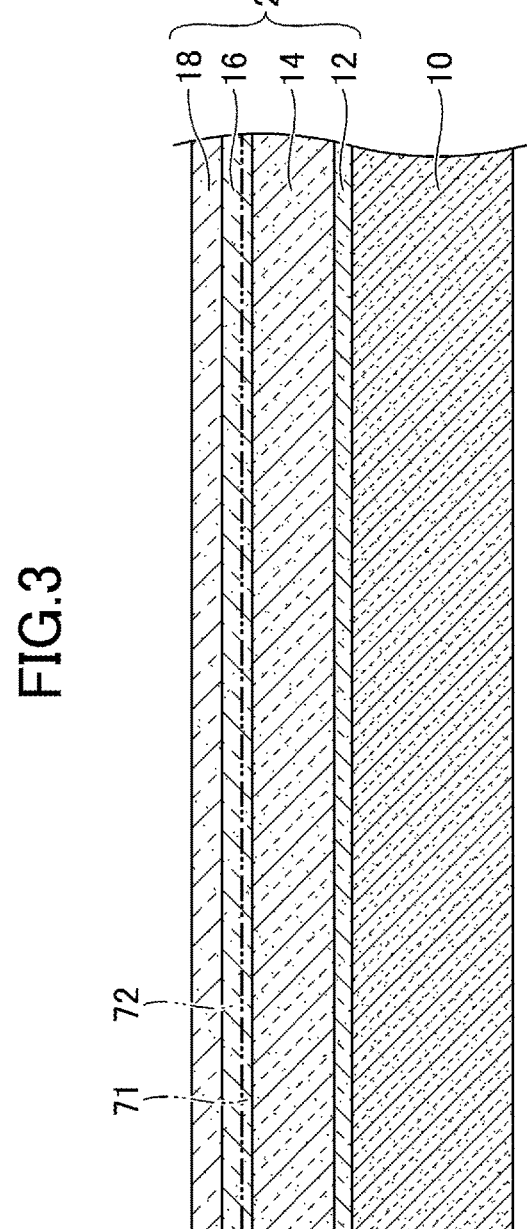
FIG. 3 is a cross-sectional view (first view) illustrating a method of manufacturing a semiconductor device according to the first embodiment.

First, as illustrated in FIG. 3, the laminated structure 20 including a plurality of nitride semiconductor layers is formed on the substrate 10 by a metal organic chemical vapor deposition (MOCVD) method.

Specifically, first, the nucleation layer 12 is grown on substrate 10. When the nucleation layer 12 is an AlN layer, a source gas is trimethylaluminum (TMA) and ammonia (NH₃), for example. TMA is an example of an Al precursor.

Next, the channel layer 14 is grown on the nucleation layer 12. When the channel layer 14 is a GaN layer, a source gas is trimethylgallium (TMG) and NH₃, for example. TMG is an example of a Ga precursor. At this time, the temperature of the substrate 10 is 1015° C., the pressure in a deposition chamber is 100 Torr (1.33×10² Pa), and the growth rate is 250 pm/s, for example.

Figure 11:
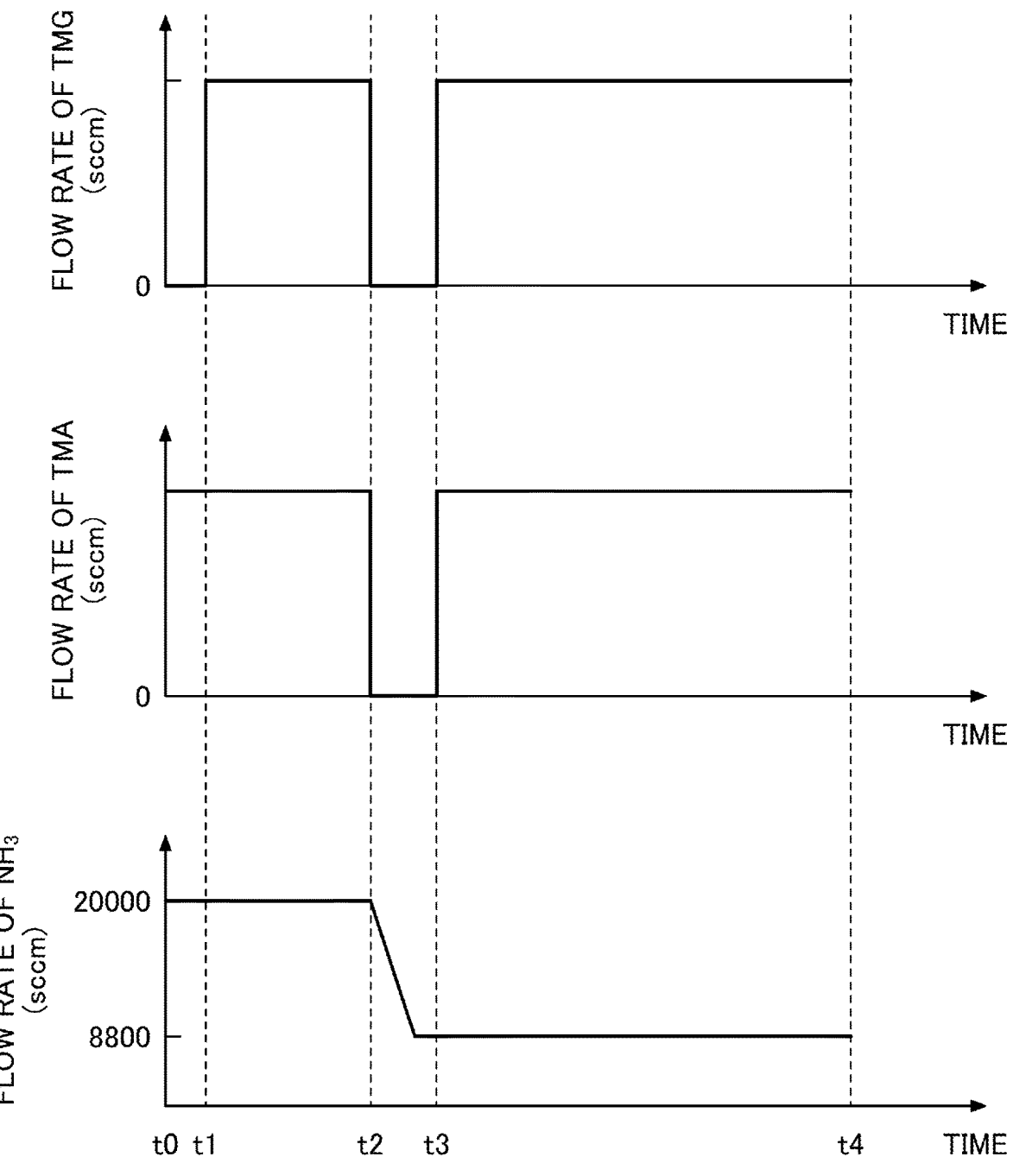
FIG. 11 is a timing chart illustrating a method of forming a barrier layer.

Next, the barrier layer 16 is grown on the channel layer 14. When the barrier layer 16 is an AlGaN layer, a source gas is TMA, TMG, and NH₃, for example. Here, a method of forming the barrier layer 16 will be described in detail. FIG. 11 is a timing chart illustrating a method of forming the barrier layer 16.

When forming the barrier layer 16, first, from time t0 to time t1, as a first condition, NH₃ and TMA are supplied to the deposition chamber without supplying TMG for a time such that a single layer is not formed, for example, for 6 seconds. At this time, for example, the temperature of the substrate 10 is 1035° C., the pressure in the deposition chamber is 100 Torr, the flow rate of TMA is 120 sccm, and the flow rate of NH₃ is 20,000 sccm. According to calculation, when the source gas is supplied for 6 seconds, the thickness of the film formed is 0.25 nm and no single layer is formed even though island-like deposits may be formed.

Next, from time t1 to time t2, as a second condition, while NH₃ and TMA continue to be supplied, TMG is supplied to the deposition chamber to form a first semiconductor layer 71 on the channel layer 14 (see FIG. 3). At this time, for example, the temperature of the substrate 10 is 1035° C., the pressure in the deposition chamber is 100 Torr, the flow rate of TMA is 120 sccm, the flow rate of TMG is 25 sccm, and the flow rate of NH₃ is 20,000 sccm. The flow rates of NH₃, TMA, and TMG are adjusted so that the Al composition in the first semiconductor layer 71 is, for example, 30% or less (X≤0.30). This is because the first semiconductor layer 71 can be easily formed while maintaining deposits formed on the surface of the channel layer 14 from time t0 to time t1.

Next, from time t2 to time t3, while NH₃ continues to be supplied, the supply of TMA and TMG is temporarily stopped and the setting value of the deposition device regarding the flow rate of $$NH_3$$

is changed to 8800 sccm. As a result, the flow rate of NH₃ decreases to 8800 sccm.

Thereafter, from time t3 to time t4, as a third condition, while $$NH_3$$

continues to be supplied with the decreased flow rate, the supply of TMA and TMG into the deposition chamber is resumed, and a second semiconductor layer 72 is formed on the first semiconductor layer 71 (see FIG. 3). At this time, for example, the temperature of the substrate 10 is 1035° C., the pressure in the deposition chamber is 100 Torr, the flow rate of TMA is 90 scam, the flow rate of TMG is 20 sccm, and the flow rate of $$NH_3$$

is 8800 scam. The flow rates of $$NH_3,$$

TMA, and TMG are adjusted so that the Al composition in the second semiconductor layer 72 is higher than 30% (X>0.30), for example. The flow rates of NH₃, TMA, and TMG are adjusted so that the Al composition in the second semiconductor layer 72 is preferably higher than 35%

(X>0.35), more preferably higher than 38% (X>0.38), and further preferably higher than 40% (X>0.40). This is to obtain high output power of the HEMT.

In this manner, the barrier layer 16 having the Al composition profile illustrated in FIG. 2 is formed.

After formation of the barrier layer 16, the cap layer 18 is formed on the barrier layer 16. When the cap layer 18 is a GaN layer, the source gas is TMG and $NH_3$, for example.

Figure 4:
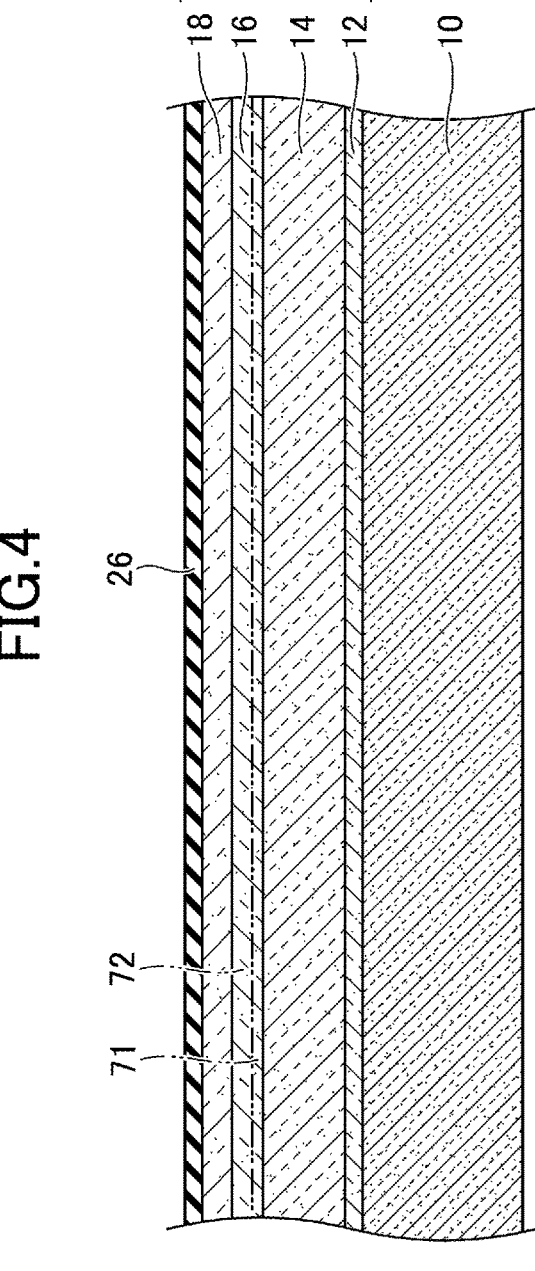
FIG. 4 is a cross-sectional view (second view) illustrating the method of manufacturing a semiconductor device according to the first embodiment.

Next, as illustrated in FIG. 4, the passivation film 26 in contact with the top surface of the laminated structure 20 is deposited using a low pressure CVD method or a plasma CVD method. For example, when the low pressure CVD method is used, the deposition temperature is 600° C. to 850° C., and the growth pressure is 10 Pa to 50 Pa, for example. The passivation film 26 formed by the low pressure CVD method is denser and harder than that formed by the plasma CVD method. A part (lower layer) of the passivation film 26 may be formed by the low pressure CVD method, and the rest (upper layer) of the passivation film 26 may be formed by the plasma CVD method. When the passivation film 26 is formed by the low pressure CVD method, ammonia gas and dichlorosilane ($SiH_2Cl_2$) are used as a source gas.

Figure 5:
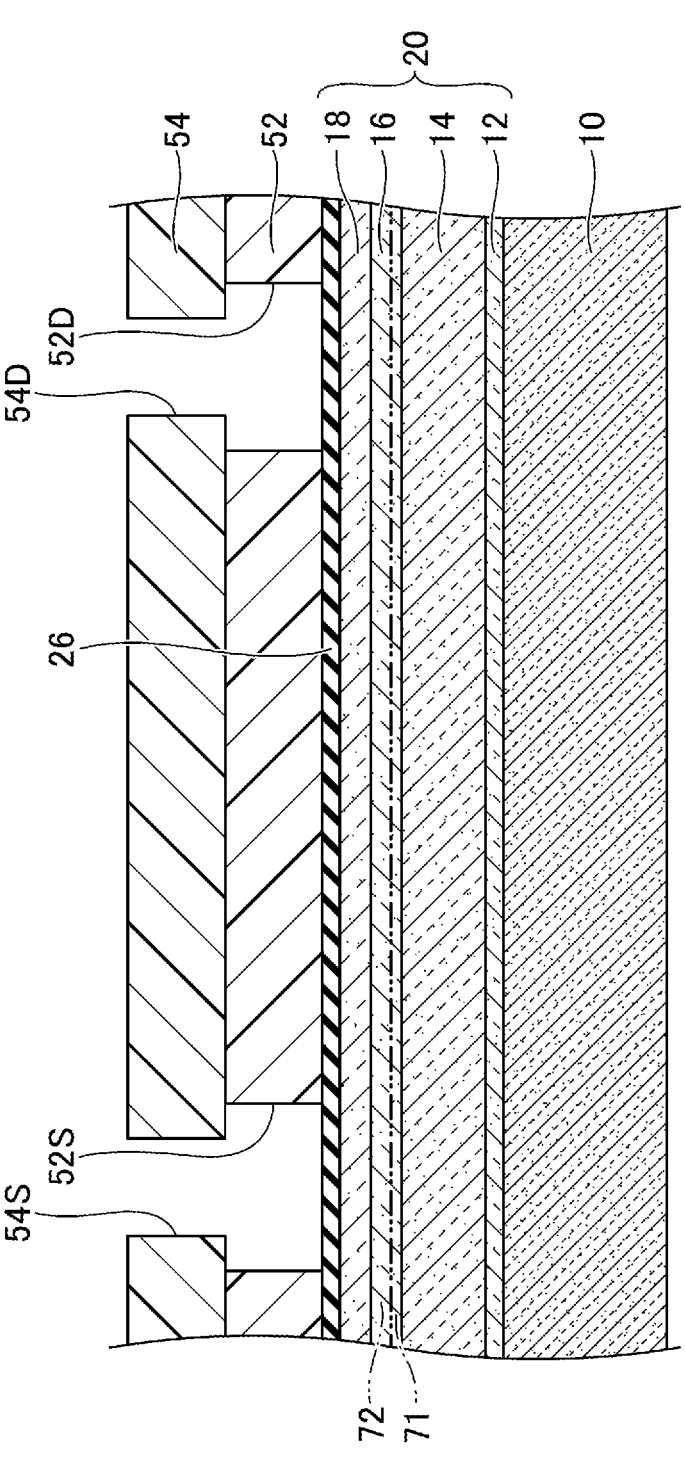
FIG. 5 is a cross-sectional view (third view) illustrating the method of manufacturing a semiconductor device according to the first embodiment.

Next, as illustrated in FIG. 5, a photoresist 52 and a photoresist 54 are applied in this order on the passivation film 26. For example, the material of the photoresist 54 is polymethylglutarimide (PMGI) and the photoresist 54 is an i-line resist. Then, by photolithography, the photoresist 54 is formed with a source opening 54S and a drain opening 54D, and the photoresist 52 is formed with a source opening 52S and a drain opening 52D. Portions of the passivation film 26 are exposed through the openings 54S and 52S, and other portions of the passivation film 26 are exposed through the openings 54D and 52D.

Figure 6:
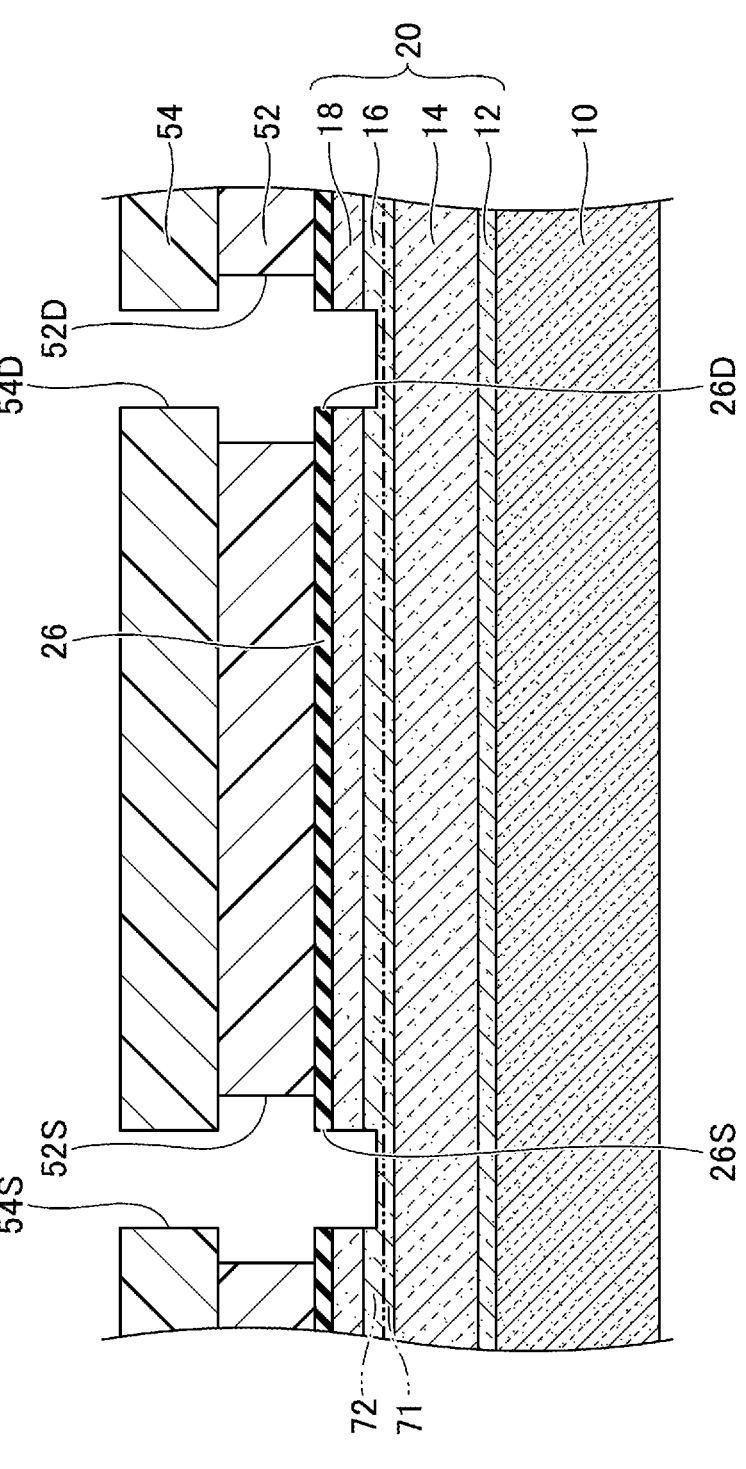
FIG. 6 is a cross-sectional view (fourth view) illustrating the method of manufacturing a semiconductor device according to the first embodiment.

Next, as illustrated in FIG. 6, the source opening 26S and the drain opening 26D are formed in the passivation film 26 and in the laminated structure 20 by reactive ion etching (RIE) using the photoresist 52 and the photoresist 54 as a mask. For example, a reactive gas containing fluorine (F) is used for etching the passivation film 26, and a reactive gas containing chlorine (Cl) is used for etching the laminated structure 20.

Figure 7:
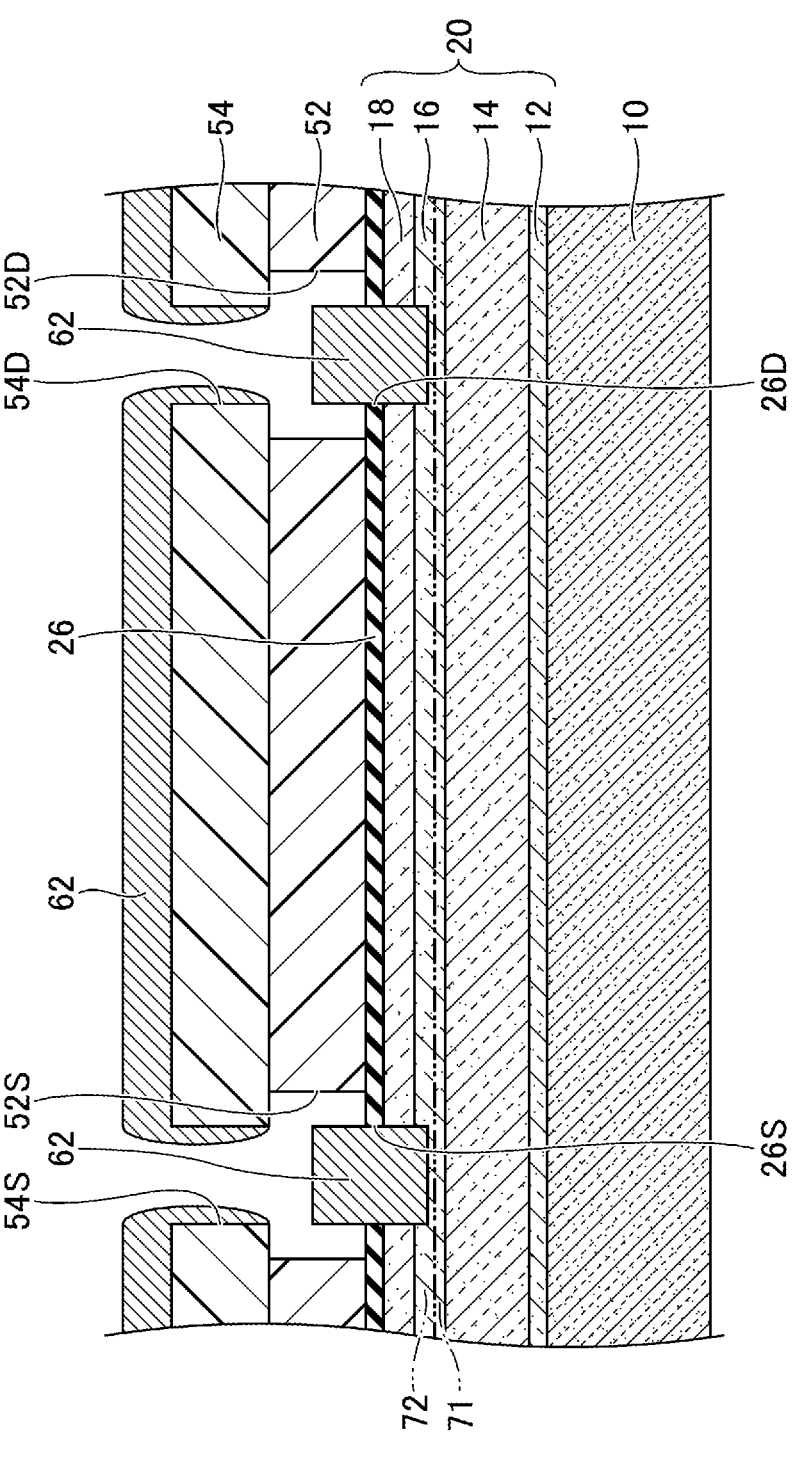
FIG. 7 is a cross-sectional view (fifth view) illustrating the method of manufacturing a semiconductor device according to the first embodiment.

Next, as illustrated in FIG. 7, metal layers 62 are formed inside the source opening 26S and inside the drain opening 26D by a deposition method. The metal layers 62 are formed to project upwardly from the source opening 26S and from the drain opening 26D. The metal layer 62 also adheres to the top surface of the photoresist 54, to the sidewall of the opening 54S, and to the sidewall of the opening 54D. The metal layer 62 includes, for example, a Ti layer and an Al layer which are formed in order from the side of the substrate 10. For example, the thickness of the Ti layer is 30 nm and the thickness of the Al layer is 300 nm.

Figures 8, 9:
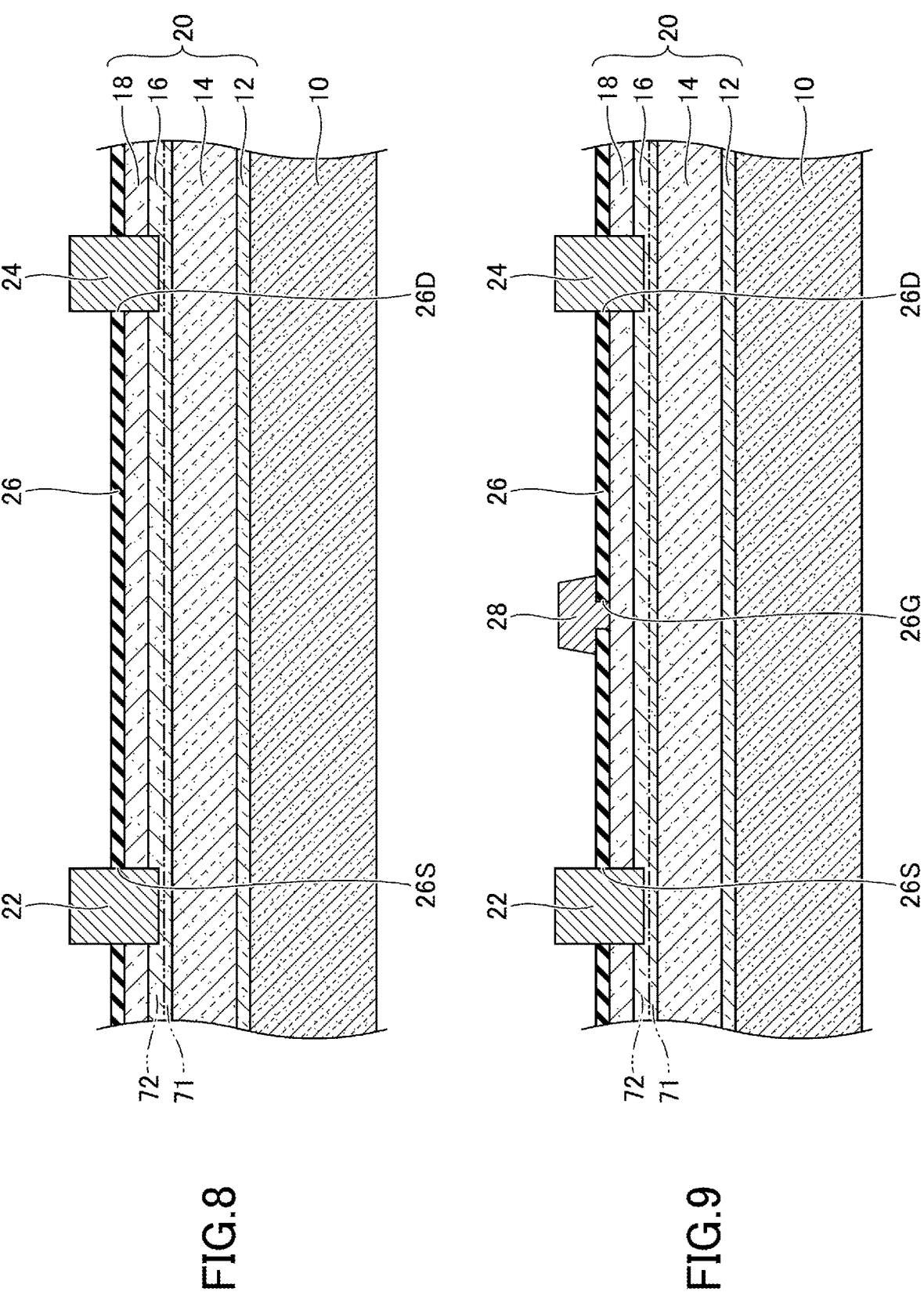
FIG. 8 is a cross-sectional view (sixth view) illustrating the method of manufacturing a semiconductor device according to the first embodiment.
FIG. 9 is a cross-sectional view (seventh view) illustrating the method of manufacturing a semiconductor device according to the first embodiment.

Next, as illustrated in FIG. 8, the photoresist 52 and the photoresist 54 are removed. By removing the photoresist 54, the portion of the metal layer 62 adhered to the photoresist 54 is also removed. In contrast, the metal layer 62 remains inside the source opening 26S and the drain opening 26D. In other words, a liftoff is performed. As a result, the source electrode 22 is formed in the source opening 26S and the drain electrode 24 is formed in the drain opening 26D.

Next, the source electrode 22 and the drain electrode 24 are alloyed by heat treatment. The alloying temperature is, for example, 600° C. As a result, the source electrode 22 and the drain electrode 24 come into ohmic contact with the laminated structure 20.

Next, as illustrated in FIG. 9, a gate opening 26G is formed in the passivation film 26. When forming the gate opening 26G, a resist mask having an opening corresponding to the gate opening 26G is formed on the passivation film 26, and the passivation film 26 is etched through the resist mask. For example, a reactive gas containing fluorine is used for etching the passivation film 26. Then, the resist mask is removed. Next, the gate electrode 28 is formed in Schottky contact with the laminated structure 20 via the gate opening 26G. The gate electrode 28 includes, for example, a Ni layer, an Au layer, and a Ta layer formed in order from the side of the substrate 10.

Figure 10:
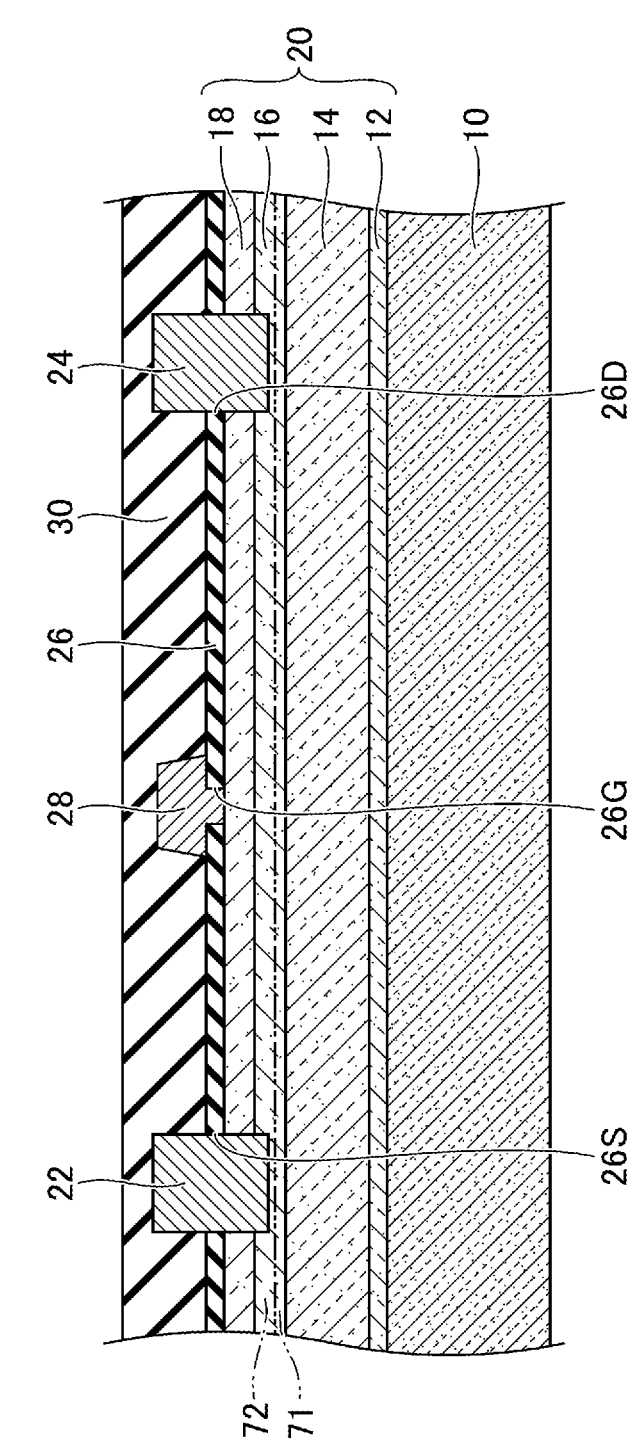
FIG. 10 is a cross-sectional view (eighth view) illustrating the method of manufacturing a semiconductor device according to the first embodiment.

Next, as illustrated in FIG. 10, the insulating film 30 is formed on the passivation film 26 to cover the gate electrode 28. The insulating film 30 is formed, for example, by a plasma CVD method.

Then, wiring and the like is formed as necessary. In this manner, the semiconductor device 1 according to the first embodiment can be manufactured.

According to the manufacturing method, when forming the barrier layer 16, from time t0 to time t1, $NH_3$ and TMA are supplied to the deposition chamber without supplying TMG for a time such that a single layer is not formed. Accordingly, it is easy to set the slope of the first straight line L1 to 20%/nm or more and 65%/nm or less. When the second semiconductor layer 72 is formed without forming the first semiconductor layer 71 after the time t1, the state of the surface of the channel layer 14 tends to change in the initial stage of forming the second semiconductor layer 72, and the crystallinity of the second semiconductor layer 72 tends to deteriorate. In contrast, when the first semiconductor layer 71 is formed before forming the second semiconductor layer 72, the first semiconductor layer 71 with good crystallinity can be formed without changing the state of the surface of the channel layer 14, and the second semiconductor layer 72 with good crystallinity can be formed on the first semiconductor layer 71. Therefore, the barrier layer 16 including the first semiconductor layer 71 and the second semiconductor layer 72 and having good crystallinity can be formed.

A first pressure, a second pressure, a third pressure, a first flow rate, a second flow rate, and a third flow rate are not particularly limited as long as at least one of the following conditions is satisfied. The first pressure and the second pressure are higher than the third pressure; or the first flow rate and the second flow rate are higher than the third flow rate. From the viewpoint of easiness of adjustment and the like, it is preferable that the first pressure is equal to the second pressure, and the first flow rate is equal to the second flow rate. It is preferable that the second pressure is equal to the third pressure, and the third flow rate is smaller than the second flow rate. Accordingly, good crystallinity can be easily obtained in the second semiconductor layer 72.

In the second condition, supplying is performed for a time such that the thickness of the first semiconductor layer 71 is preferably 0.5 nm or more and 3.0 nm or less, and more preferably 0.5 nm or more and 1.5 nm or less. When the first semiconductor layer 71 is too thick, the slope of the second straight line L2 becomes small, and the 2DEG may easily move to the barrier layer 16. When the first semiconductor layer 71 is too thin, the state of the surface of the channel layer 14 may easily change in the initial stage of forming the second semiconductor layer 72.

The source opening 26S and the drain opening 26D need only be formed in the passivation film 26, and the source opening 26S and the drain opening 26D need not be formed in the laminated structure 20.

Second Embodiment

Figure 12:
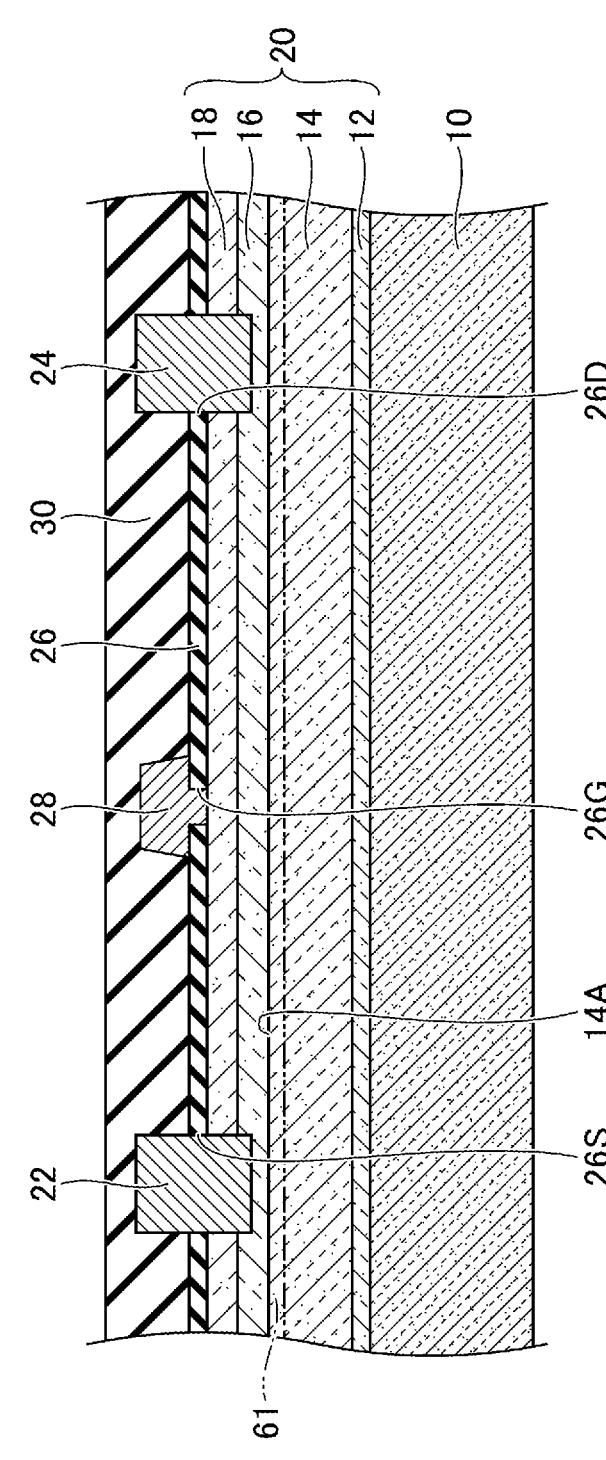
FIG. 12 is a cross-sectional view illustrating a semiconductor device according to a second embodiment.

Next, a second embodiment will be described. The second embodiment differs from the first embodiment mainly in the configuration of the channel layer. FIG. 12 is a cross-sectional view illustrating a semiconductor device according to a second embodiment.

As illustrated in FIG. 12, in a semiconductor device 2 according to the second embodiment, the channel layer 14 includes a third surface 14A that faces the barrier layer 16. The channel layer 14 includes a first layer 61 including the third surface 14A. The concentration of C in the first layer ment, the temperature of the substrate 10 is 1015° C., the pressure in the deposition chamber is 100 Torr, and the growth rate is 250 pm/s. Then, the temperature of the substrate 10 is changed to 1035° C., the pressure in the deposition chamber is kept at 100 Torr, and the growth rate is changed to 100 pm/s. In this manner, the temperature of the substrate 10 is increased and the growth rate is decreased.

Other configurations are similar to those of the first embodiment. In this manner, the semiconductor device 2 according to the second embodiment can be manufactured.

The entire channel layer 14 may be the first layer 61. In that case, the time required to form the channel layer 14 increases and the throughput decreases.

Here, the measurement results of the characteristics of the semiconductor devices manufactured by the inventor of the present application according to the first embodiment and the second embodiment will be described. Table 1 describes the conditions for forming the barrier layer. In Table 1, "thickness" is a thickness calculated from film formation time, and "Al composition" is a composition calculated from a flow rate of a source gas. In the remarks for sample No. 5, "with the first layer" indicates that the channel layer includes a layer with a thickness of 100 nm corresponding to the first layer 61 of the second embodiment.

TABLE 1

| SAMPLE No. | PROCESSING UNDER FIRST CONDITION | | PROCESSING UNDER SECOND CONDITION | | | | PROCESSING UNDER THIRD CONDITION | | | | REMARKS |
|---|---|---|---|---|---|---|---|---|---|---|---|
| | FLOW RATE OF NH$_3$ (sccm) | PRESSURE (Torr) | FLOW RATE OF NH$_3$ (sccm) | PRESSURE (Torr) | THICK-NESS (nm) | Al COMPO-SITION (%) | FLOW RATE OF NH$_3$ (sccm) | PRESSURE (Torr) | THICK-NESS (nm) | Al COMPO-SITION (%) | |
| 1 | NONE | | NONE | | | | 8800 | 50 | 10 | 36 | |
| 2 | 8800 | 100 | NONE | | | | 8800 | 100 | 10 | 36 | |
| 3 | 20000 | 100 | 20000 | 100 | 3 | 30 | 8800 | 100 | 7 | 36 | |
| 4 | 20000 | 100 | 20000 | 100 | 1 | 30 | 8800 | 100 | 9 | 36 | |
| 5 | 20000 | 100 | 20000 | 100 | 1 | 30 | 8800 | 100 | 9 | 36 | WITH FIRST LAYER |

61 is $1\times10^{16}$ cm$^{-3}$ or less. The thickness of the first layer 61 is, for example, 50 nm or more and 150 nm or less, preferably 60 nm or more and 140 nm or less, more preferably 70 nm or more and 130 nm or less, and further preferably 80 nm or more and 120 nm or less. The concentration of C in the portion closer to the substrate 10 than the first layer 61 in the channel layer 14 may exceed $1\times10^{16}$ cm$^{-3}$.

Other configurations are similar to those of the first embodiment.

According to the second embodiment, similar effects to those of the first embodiment can be obtained. In addition, because the channel layer 14 includes the first layer 61, electrons are less likely to scatter in the channel layer 14. Thus, better electron mobility can be obtained.

Figure 13:
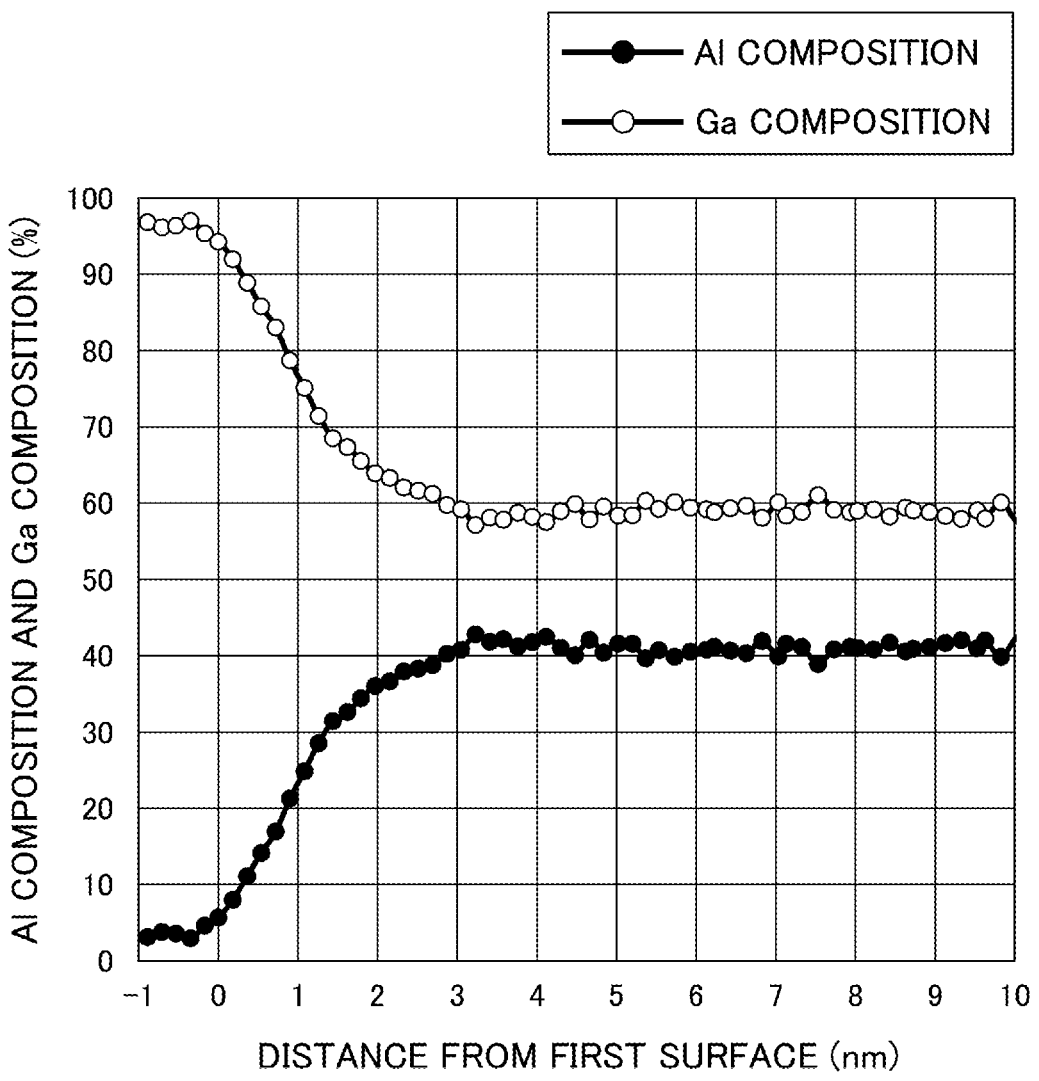
FIG. 13 is a diagram illustrating an Al composition profile in a barrier layer of sample No. 2.
Figure 14:
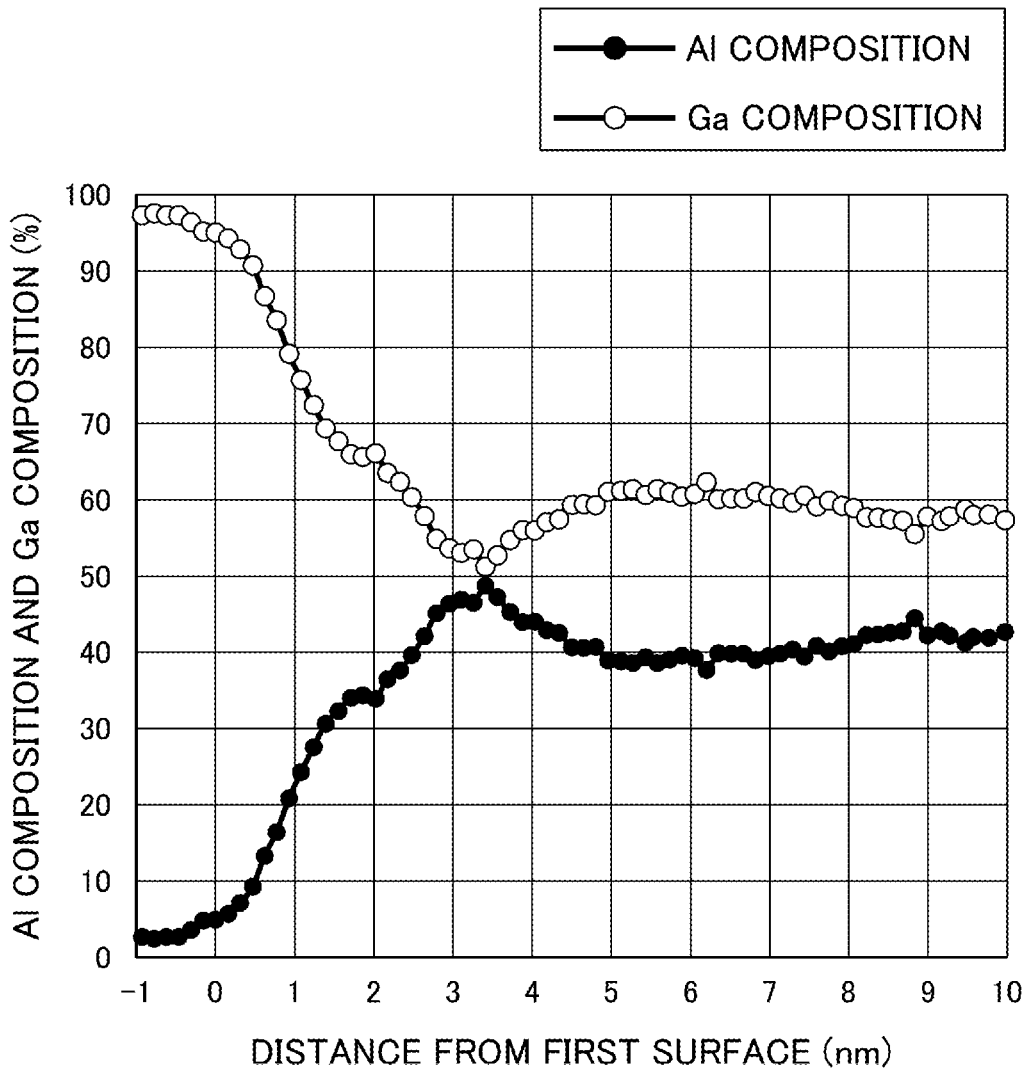
FIG. 14 is a diagram illustrating an Al composition profile in a barrier layer of sample No. 3.
Figure 15:
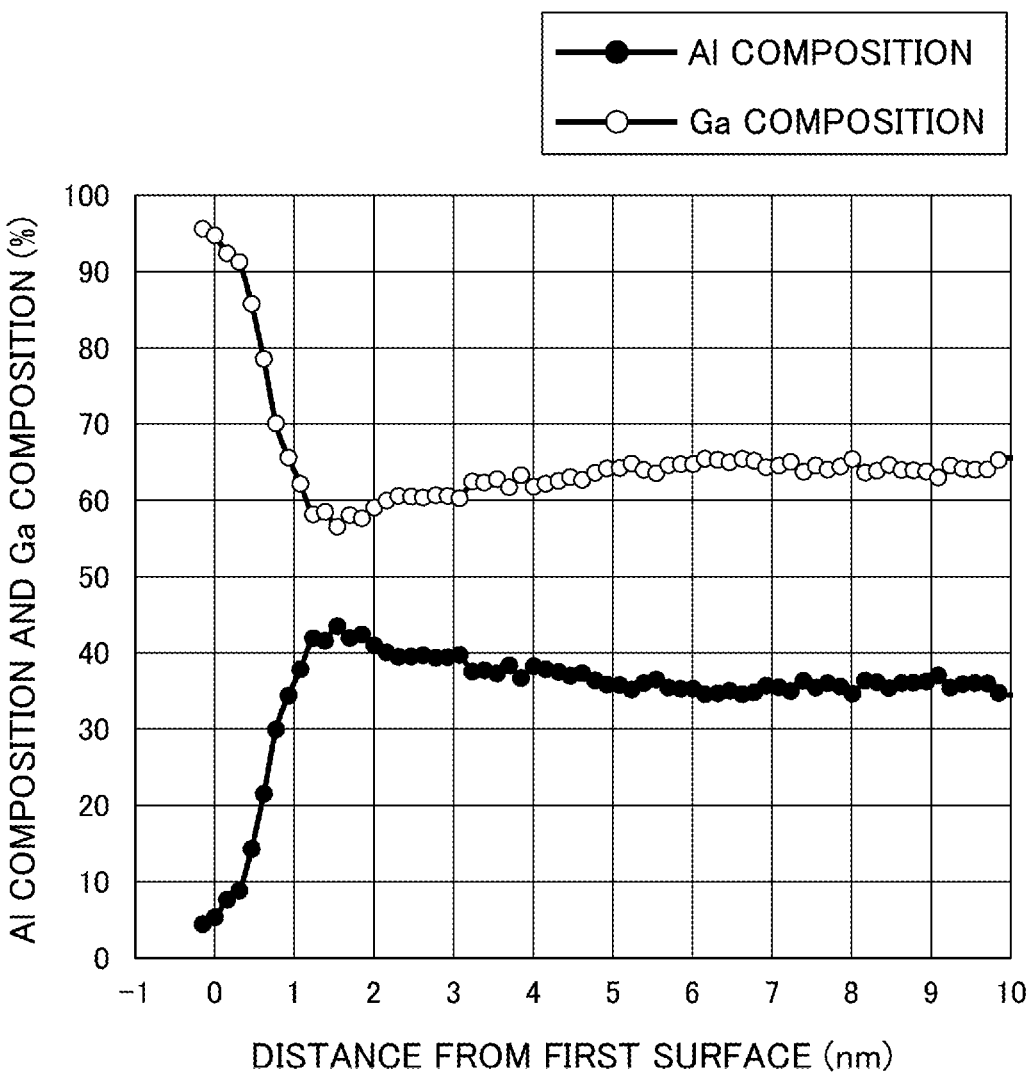
FIG. 15 is a diagram illustrating an Al composition profile in a barrier layer of sample No. 4.

Next, a method of manufacturing the semiconductor device 2 according to the second embodiment will be described. When manufacturing the semiconductor device 2, for example, the temperature and the growth rate of the substrate 10 are changed during the formation of the channel layer 14. In the initial stage, similarly to the first embodi- Other conditions of the five samples (samples No. 1 to No. 5) are common. For each sample, electron density Ns (cm$^{-2}$), mobility μ (cm$^2$/Vs), and sheet resistance Rsh (Ω/□) were measured by Hall measurement at room temperature. The results are described in Table 2. For samples No. 2 to No. 4, an Al composition profile in the barrier layer was measured by EDX. FIG. 13 is a diagram illustrating an Al composition profile in the barrier layer of sample No. 2. FIG. 14 is a diagram illustrating an Al composition profile in the barrier layer of sample No. 3. FIG. 15 is a diagram illustrating an Al composition profile in the barrier layer of sample No. 4. The horizontal axis of FIGS. 13 to 15 indicates the distance from the first surface, towards the second surface. The vertical axis of FIGS. 13 to 15 indicates the Al composition and Ga composition. Table 2 also describes a slope of the first straight line L1 and a slope of the second straight line L2 obtained from FIGS. 13 to 15. The Ga composition refers to the ratio of the number of Ga atoms to the total number of atoms of Group III elements in a III-V semiconductor.

TABLE 2

| SAMPLE No. | ELECTRON DENSITY Ns $(cm^{-2})$ | MOBILITY $\mu$ $(cm^2/Vs)$ | SHEET RESISTANCE Rsh $(\Omega/\square)$ | SLOPE OF STRAIGHT LINE L1 (%/nm) | SLOPE OF STRAIGHT LINE L2 (%/nm) |
|---|---|---|---|---|---|
| 1 | $1.18 \times 10^{13}$ | 1440 | 368.3 | 13.3 | 6.0 |
| 2 | $1.20 \times 10^{13}$ | 1500 | 330.0 | 18.9 | 11.6 |
| 3 | $1.27 \times 10^{13}$ | 1530 | 321.1 | 22.5 | 14.3 |
| 4 | $1.25 \times 10^{13}$ | 1760 | 282.4 | 43.4 | 35.7 |
| 5 | $1.38 \times 10^{13}$ | 1830 | 246.7 | 49.6 | 42.2 |

As illustrated in Table 2 and FIGS. 13 to 15, high mobility $\mu$ was obtained in samples No. 3 to No. 5. This indicates that good high-frequency characteristics of the HEMT can be obtained in samples No. 3 to No. 5.

While the embodiments have been described in detail above, there is no limitation to specific embodiments, and various modifications and changes are possible within the scope described in the claims.

What is claimed is:

1. A semiconductor device comprising:
a substrate;
a channel layer that is provided on the substrate and that includes Ga and N; and
a barrier layer that is provided on the channel layer and includes a first surface that faces the channel layer and a second surface opposite to the first surface, the barrier layer containing Al, N, and at least one of Ga or In;
wherein an average value of an Al composition in the barrier layer is 30% or more, and
wherein the barrier layer has an Al composition profile, between the first surface and the second surface, that includes a first point within the barrier layer where the Al composition is 10% at a point reached upon increasing from the first surface toward the second surface and a second point within the barrier layer where the Al composition is 30% at a point reached upon increasing from the first surface toward the second surface, and includes a first straight line connecting the first point and the second point and having a slope of 20%/nm or more and 65%/nm or less.

2. The semiconductor device according to claim 1, wherein in the Al composition profile, a slope of a second straight line connecting the first point and a third point is 20%/nm or more and 65%/nm or less, in which the third point is a point where the Al composition first reaches 40% upon increasing from the first surface toward the second surface.

3. The semiconductor device according to claim 1, wherein the channel layer is a GaN layer, and the barrier layer is one of an AlGaN layer, an InAlN layer, or an InAlGaN layer.

4. The semiconductor device according to claim 1, wherein the average value of the Al composition in the barrier layer is 35% or more.

5. The semiconductor device according to claim 1,
wherein the channel layer includes a third surface that faces the barrier layer,
wherein the channel layer includes a first layer and a portion closer to the substrate than the first layer, the first layer including the third surface and having a concentration of C of $1 \times 10^{16}$ cm$^{-3}$ or less, and the portion having a concentration of C that exceeds $1 \times 10^{16}$ cm$^3$, and wherein a thickness of the first layer is 50 nm or more and 150 nm or less.

6. A method of manufacturing a semiconductor device comprising:
forming, on a substrate, a channel layer that includes Ga and N; and
forming, on the channel layer, a barrier layer that includes a first surface that faces the channel layer and a second surface opposite to the first surface, the barrier layer containing Al, N, and at least one of Ga or In;
wherein an average value of an Al composition in the barrier layer is 30% or more, and
wherein the barrier layer has an Al composition profile, between the first surface and the second surface, that includes a first point within the barrier layer where the Al composition is 10% at a point reached upon increasing from the first surface toward the second surface and a second point within the barrier layer where the Al composition is 30% at a point reached upon increasing from the first surface toward the second surface, and includes a first straight line connecting the first point and the second point and having a slope of 20%/nm or more and 65%/nm or less.

7. The method of manufacturing a semiconductor device according to claim 6,
wherein forming the barrier layer includes:
supplying, as a first condition, ammonia and an Al precursor to a deposition chamber without supplying a Ga precursor and an In precursor for a time such that a single layer is not formed;
supplying, as a second condition, ammonia, the Al precursor, and at least one of the Ga precursor or the In precursor to the deposition chamber to form a first semiconductor layer on the channel layer; and
supplying, as a third condition, ammonia, the Al precursor, and at least one of the Ga precursor or the In precursor to the deposition chamber to form a second semiconductor layer on the first semiconductor layer,
wherein a first pressure in the deposition chamber in the first condition, a second pressure in the deposition chamber in the second condition, a third pressure in the deposition chamber in the third condition, a first flow rate of ammonia in the first condition, a second flow rate of ammonia in the second condition, and a third flow rate of ammonia in the third condition satisfy at least one condition of: the first pressure and the second pressure are higher than the third pressure; or the first flow rate and the second flow rate are higher than the third flow rate.

8. The method of manufacturing a semiconductor device according to claim 7, wherein the first pressure is equal to the second pressure, and the first flow rate is equal to the second flow rate.

9. The method of manufacturing a semiconductor device according to claim 7, wherein the second pressure is equal to the third pressure, and the third flow rate is smaller than the second flow rate.

10. The method of manufacturing a semiconductor device according to claim 7, wherein, in the second condition, flow rates of ammonia, the Al precursor, and at least one of the Ga precursor or the In precursor supplied to the deposition chamber are adjusted so that an Al composition in the first semiconductor layer is 30% or less, and wherein, in the third condition, flow rates of ammonia, the Al precursor, and at least one of the Ga precursor or the In precursor supplied to the deposition chamber are adjusted so that an Al composition in the second semiconductor layer is higher than 30%.

11. The method of manufacturing a semiconductor device according to claim 7, wherein, in the second condition, supplying is performed for a time such that a thickness of the first semiconductor layer is 0.5 nm or more and 3.0 nm or less.

12. The method of manufacturing a semiconductor device according to claim 11, wherein, in the second condition, supplying is performed for a time such that a thickness of the first semiconductor layer is 0.5 nm or more and 1.5 nm or less.

13. The method of manufacturing a semiconductor device according to claim 6, wherein the channel layer includes a third surface that faces the barrier layer, wherein forming the channel layer includes forming a first layer and a portion closer to the substrate than the first layer, the first layer including the third surface, and having a concentration of C of $1 \times 10^{16}$ cm$^{-3}$ or less, and the portion having a concentration of C that exceeds $1 \times 10^{16}$ cm$^3$, and wherein a thickness of the first layer is 50 nm or more and 150 nm or less.

\* \* \* \* \*